United States Patent
Kumakura

(10) Patent No.: US 6,780,898 B2
(45) Date of Patent: Aug. 24, 2004

(54) ADHESIVE COMPOSITION

(75) Inventor: Hiroyuki Kumakura, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/761,191

(22) Filed: Jan. 18, 2001

(65) Prior Publication Data

US 2001/0018477 A1 Aug. 30, 2001

(30) Foreign Application Priority Data

Jan. 26, 2000 (JP) .......................................... 2000-021870

(51) Int. Cl.[7] .................................................. C08F 2/46
(52) U.S. Cl. ........................ 522/168; 522/100; 522/170; 522/134; 522/146; 252/500; 252/514; 252/513; 252/512; 428/355 EP; 428/345; 428/343
(58) Field of Search ................................. 522/100, 168, 522/170, 134, 146; 256/500, 512, 513, 514; 428/355 EP, 345, 343; 427/508, 516

(56) References Cited

U.S. PATENT DOCUMENTS

| | | | | |
|---|---|---|---|---|
| 3,977,874 A | * | 8/1976 | Roteman | 96/35.1 |
| 4,394,403 A | * | 7/1983 | Smith | 427/42 |
| 4,632,891 A | * | 12/1986 | Banks et al. | 430/18 |
| 5,674,922 A | * | 10/1997 | Igarashi et al. | 522/168 |
| 5,721,020 A | * | 2/1998 | Takami et al. | 427/508 |
| 5,882,842 A | * | 3/1999 | Akaki et al. | 430/280.1 |
| 6,084,004 A | * | 7/2000 | Weinmann et al. | 522/25 |
| 6,165,386 A | * | 12/2000 | Endo et al. | 252/500 |
| 6,166,101 A | * | 12/2000 | Takami | 522/168 |

FOREIGN PATENT DOCUMENTS

| | | | |
|---|---|---|---|
| JP | 58-198532 | 11/1983 | |
| JP | A 8-277385 | 10/1996 | |
| JP | A 8-283379 | 10/1996 | |
| JP | 08-288385 | 11/1996 | |
| JP | 11152441 A | * 6/1999 | ......... C09D/163/00 |
| JP | 11-322944 | 11/1999 | |
| JP | 2001-072957 | 3/2001 | |
| JP | 2001-131516 | 5/2001 | |

* cited by examiner

Primary Examiner—James J. Seidleck
Assistant Examiner—Sanza L. McClendon
(74) Attorney, Agent, or Firm—Oliff & Berridge, PLC

(57) ABSTRACT

An adhesive composition is obtained which has high reactivity and is able to connect even plastic substrates with high connection reliability. The adhesive composition is constituted of insulating resin, photopolymerization initiator, and oxetan compound.

4 Claims, No Drawings

ADHESIVE COMPOSITION

BACKGROUND OF THE INVENTION

1. Field of the Invention

The present invention pertains to an adhesive composition suitable for connecting plastic substrates used in plastic liquid crystal displays (PLCDs), etc.

2. Description of the Related Art

Thermosetting anisotropic conductive epoxy-adhesive films have been known and used for practical purposes as a connecting material to be used around the edges of liquid crystal displays (LCDs).

Moreover, plastic liquid crystal displays wherein a plastic substrate has been substituted for the glass substrate of conventional liquid crystal displays have recently been developed in order to make liquid crystal displays lightweight. As a connecting material for such a plastic substrate, conventional thermosetting anisotropic conductive epoxy-adhesive films have also been used.

However, plastic substrates used in conventional plastic liquid crystal displays have inferior heat resistance when compared to glass substrates. On the other hand, the connecting temperature for conventional thermosetting anisotropic conductive epoxy-adhesive films is around 200° C. Therefore, there is a problem that when conventional thermosetting anisotropic conductive epoxy-adhesive film is used to connect plastic substrates, the substrates will deform and good quality is not obtained.

Against the problem, a low-temperature-setting anisotropic conductive film of a radical polymerization type of which the setting temperature can be 100 to 140° C. has been proposed. However, although deformation of the substrate can be controlled by use of this low-temperature-setting anisotropic conductive adhesive film, sufficient connection reliability is not obtained. This is apparently because the low-temperature-setting anisotropic conductive film of a radical polymerization type has a higher coefficient of cure shrinkage than a thermosetting anisotropic conductive epoxy-adhesive film and therefore, internal stress readily remains and peeling readily occurs after aging, particularly after aging under high humidity.

Moreover, photosetting anisotropic conductive adhesive films of a radical polymerization type that utilize ultraviolet rays are also known as connecting materials with a lower connecting temperature than conventional thermosetting anisotropic conductive epoxy-adhesive, but similarly to the above-mentioned low-temperature-setting anisotrpic conductive adhesive film, sufficient connection reliability cannot be obtained even though thermal deformation of the substrate can be prevented.

SUMMARY OF THE INVENTION

The present invention solves the above-mentioned problems with related art, its object is to obtain a connecting material, such as anisotropic conductive adhesive film or the like, by use of which it is possible to obtain sufficient connection reliability, even for connecting plastic substrates that are used in plastic liquid crystal displays.

The inventor completed the present invention upon discovering that when oxetan compounds are mixed in adhesive compositions of a cationic photopolymerization type, reactivity of the adhesive composition can be increased and curing time markedly shortened, and connection reliability can be increased and even plastic substrates with low heat resistance can be well connected.

That is, the present invention presents an adhesive composition, comprising an insulating resin, a photopolymerization initiator, and an oxetan compound.

DESCRIPTION OF THE PREFERRED EMBODIMENTS

The present invention will now be described in detail.

The adhesive composition of the present invention contains an insulating resin, a photopolymerization initiator, and an oxetan compound.

As the insulating resin, an epoxy resin, a vinyl ether resin, a lactone resin or the like can be used. The use of epoxy resin is particularly preferred because it is relatively inexpensive and has excellent heat resistance and adhesion.

As the epoxy resin, bisphenol A, bisphenol F, novolak, an alicyclic, liquid or solid epoxy resin or the like can be preferably used. In particular, it is possible to increase the curing rate upon curing by irradiation with ultraviolet rays when using an alicyclic epoxy resin.

A general photopolymerization initiator, such as one having aromatic sulfonium salt residue, can be used as the photopolymerization initiator. For instance, 4,4'-bis[di(β-hydroxyethoxy)phenylsulfonio]phenyl sulfide bishexafluoroantimonate or the like (Adekaoptomer SP-170, SP-150, etc., available from Asahi Denka Co., Ltd.) can be preferably used.

The amount of a photopolymerization initiator used is preferably 0.5 to 5 wt % in 100 wt % of the adhesive composition. There are cases wherein adhesion drops when too much photopolymerization initiator is used. On the other hand, curing is difficult if the amount of photopolymerization initiator used is too small.

The oxetan compound in the present invention refers to a variety of compounds having oxetan rings of the following formula:

This oxetan compound is used in order to increase reactivity of the adhesive composition, constituting the significant feature of the invention. The reason for the increase in reactivity of the adhesive composition as a result of using the oxetan compound appears to be as follows: That is, cationic ring-opening polymerization of cyclic ether compounds having the oxetan ring used in the present invention and of cyclic ether compounds having oxiran rings of the following formula used as conventional reaction promoters in cationic polymerization are considered to be based on an attack on oxonium ions by neutral molecules and to generally proceed by an SN2 reaction.

Ring strain energy of the cyclic ether compound, the nucleophilic property (basicity), steric hindrance, etc., appear to be factors that greatly affect to the reaction rate here. The ring strain energy is a factor that controls ring-open-abilities. Basicity is an indicator representing the intensity of the attack on the active terminals. Ring strain energy of the unsubstituted oxetan ring is 27.3 kcal/mol, and ring strain energy of the unsubstituted oxiran ring is 25.5 kcal/mol. Therefore, a large difference is not seen between the two. However, pKb, which shows basicity, of the oxetan ring is 7.4, while that of the oxiran ring is 3.1, pKb of the oxetan ring being larger than that of the oxiran ring. Kb here is the dissociation constant of the base and the smaller pKb is, the stronger basicity becomes. Therefore, it appears that basicity of the oxygen on the oxiran ring is weaker than the ether oxygen in the product polymer main chain and therefore, chain transfer from the polymerization active terminal to the ether oxygen in the polymer main chain readily occurs and a reduction in the polymerization rate and a reduction in the degree of polymerization due to the production of cyclic oligomer by-product occur. On the other hand, because basicity of the oxygen on the oxetan ring is strong, there is a reduction in chain transfer to the polymer main chain. Consequently, the oxetan ring is more reactive in ring-opening polymerization than the oxiran ring. Examples of oxetan compounds include as exemplified below.

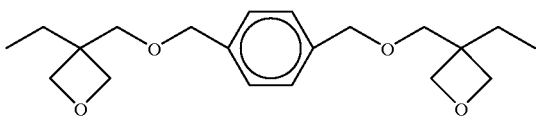

xylylene dioxetan (XDO),

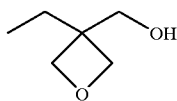

3-ethyl-3-(hydroxymethyl)oxetan (EOXA),

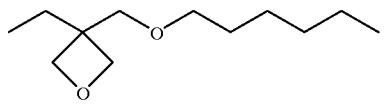

3-ethyl-3-(hexyloxymethyl)oxetan (HOX),

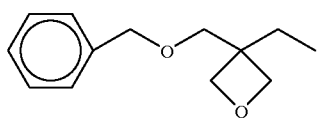

3-ethyl-3-(phenoxymethyl)oxetan (PHO),

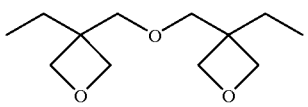

bis{[1-ethyl(3-oxetanyl)]methyl}ether (DOX).

XDO and DOX with two functional groups are particularly preferable because of their high reactivity.

The amount of oxetan compound used depends on the type of insulating resin used in the adhesive composition. For example, it is preferably the amount thereof 5 to 50 wt % in 100 wt % adhesive composition. If too much the amount thereof is used, there will be an excessive increase in reactivity of the adhesive composition and the cured product will be hard and there will be an increase in connection resistance when the adhesive composition is used as an anisotropic conductive adhesive agent. On the other hand, if too little is mixed, it will not be possible to sufficiently increase reactivity of the adhesive composition.

A variety of other additives, for instance, isocyanate crosslinking agents, coupling agents such as epoxy silane compounds, an epoxy-modified silicone resin, thermosetting insulating resin such as a phenoxy resin or the like can be added as needed to the adhesive composition of the present invention.

An anisotropic conductive adhesive composition can be obtained by further mixing conductive particles with the adhesive composition of the present invention.

For instance, a variety of electrically conductive particles that have been used in the past as anisotropic electrically conductive adhesives. Examples of such the electrically conductive particles include metal powder such as Ni powder, Ag powder, Cu powder, alloy powder thereof or the like, spherical resin particles which have been metal-plated on the surface thereof, particles made from these good electric conductors which is coated on the surface thereof with an insulating resin layer. Particle diameter of the electrically conductive particles is preferably 0.2 to 20 μm.

The adhesive composition of the present invention can be produced by mixing each of the above-mentioned components by conventional methods using a solvent as needed. Its form can be any form, such as paste-form, film-form, etc.

The adhesive composition that is obtained will quickly cure with irradiation with ultraviolet rays, etc. For instance, when the adhesive composition of the present invention is molded into a film-shaped sheet (thickness of about 25 μm) and this is sandwiched between a plastic substrate made of polyether sulfone (PES) resin and a two-layered flexible printed circuit (FPC) and irradiated with ultraviolet rays (exposure conditions: metal halide lamp 3,000 mJ/cm$^2$), it cures within 10 seconds and these can be connected. Consequently, the adhesive composition of the present invention is useful as a connecting material for a variety of substances to be connected. Connection temperature can be 100° C. or lower and therefore, it is possible to obtain a good connection between the electrodes on the plastic substrate used in a plastic liquid crystal display and the electrodes on a circuit board that are facing the aforementioned electrodes. The present invention also includes this connected structure.

EXAMPLES

The present invention will now be described in specific terms based on examples.

Example 1

The components in Table 1 below were uniformly mixed using a 1:1 mixed solvent of toluene and MEK. With the mixture obtained a PET film was coated. The solvent was evaporated to obtain an anisotropic conductive adhesive film.

This anisotropic conductive film was temporarily affixed to the circuit part of a flexible printed circuit board, placed to face the plastic substrate and temporarily fixed thereto. Curing was performed at 60° C. by irradiation with ultraviolet rays (metal halide lamp, luminous energy of 3,000 mJ/cm$^2$) from the plastic substrate side while applying pressure (0.98 mPa) to the connecting part to obtain a connected structure composed of a flexible printed circuit and a plastic substrate.

(1) Stability of connection resistance, (2) peeling strength, (3) reactivity, and (4) appearance of the connected structure that was obtained were evaluated as follows. The results are shown in Table 1.

(1) Stability of Connection Resistance

The connected structure was aged for 500 hours at 60° C. and 95% RH and resistance before and after aging was determined. Stability of connection resistance was evaluated by the following criteria based on the extent of the rise in resistance:

Rank: Creteria

A When resistance rose by less than 10Ω;

B When resistance rose by at least 10Ω but no more than 50Ω;

C When resistance rose by 50Ω or more.

(2) Peeling Strength (mN/cm)

The connected structure was aged for 500 hours at 60° C. and 95% RH and peeling strength at a 90° angle was determined before and after aging.

(3) Reactivity

Reactivity was determined by FT-IR.

(4) Appearance

The connected part was checked by visually observed and evaluated by the following criteria based on the presence or absence of lifting.

Rank: Creteria

A When there was no lifting;

B When there is less than 30% of lilgting;

C When there is 30% or more of lifting.

Examples 2 to 10

Except that the adhesive composition components were used as shown in Table 1, an anisotropic conductive adhesive composition was prepared in the same manner as in Example 1, and an IC chip (0.4 mm thick, 6×6 mm, 100×100 μm bumps (Au plating), bump pitch of 150 μm) was packaged in the same plastic substrate as in Example 1 under the same connecting conditions as in Example 1, using the anisotropic conductive adhesive composition that was obtained, and evaluated. The results are shown in Table 1.

Comparative Example

Except that 20 parts by weight of alicyclic epoxy resin (Union Carbide, ERL4299) were substituted for the 20 parts by weight oxetan compound (XDO) in the components of the adhesive composition of Example 1, an anisotropic conductive adhesive film was prepared in the same manner as in Example 1, and a connected structure was obtained using this anisotropic conductive film. The connected structure that was obtained was evaluated. The results are shown in Tables 1 and 2.

TABLE 1

(weight parts)

| Component | Example 1 | 2 | 3 | 4 | 5 | 6 |
|---|---|---|---|---|---|---|
| (Insulating resin) | | | | | | |
| Phenoxy resin*1 | 40 | — | — | — | — | — |
| Alicyclic epoxy resin*2 | 30 | 20 | 20 | 20 | 20 | 20 |
| Alicyclic epoxy resin*3 | — | — | — | — | — | — |
| Bisphenol A-type epoxy resin*4 | 10 | — | — | — | — | — |
| Bisphenol A-type epoxy resin*5 | — | 10 | 10 | 10 | 10 | 10 |
| Naphthalene-skeleton epoxy resin*6 | — | 40 | 40 | 40 | 40 | 20 |
| (Oxetan compound) | | | | | | |
| XDO (Toa Gosei K.K.) | 20 | 20 | 20 | 20 | 20 | 30 |
| EOXA (Toa Gosei K.K.) | — | 10 | — | — | — | — |
| HOX (Toa Gosei K.K.) | — | — | 10 | — | — | — |
| PHO (Toa Gosei K.K) | — | — | — | 10 | — | 20 |
| DOX (Toa Gosei K.K.) | — | — | — | — | 10 | — |
| Silane coupling agent*7 | 1 | 1 | 1 | 1 | 1 | 1 |
| Cationic photopolymerization initiator*8 | 3 | — | — | — | — | — |
| Cationic photopolymerization initiator*9 | — | 3 | 3 | 3 | 3 | 3 |
| Electrically conductive particles*10 | 5 | 10 | 10 | 10 | 10 | 10 |
| (Evaluation) | | | | | | |
| Rise in resistance | A | A | A | A | A | A |
| Peeling strength | | | | | | |
| (before aging) (mN/cm) | 5390 | 4700 | 4410 | 5390 | 5590 | 4410 |
| (after aging) (mN/cm) | 4120 | 4020 | 4120 | 4700 | 4410 | 4210 |
| Reactivity (%) | 82 | 85 | 82 | 80 | 84 | 87 |
| Appearance | A | A | A | A | A | A |

TABLE 2

(weight parts)

| Component | Example 7 | 8 | 9 | 10 | Comp. Ex. |
|---|---|---|---|---|---|
| (Insulating resin) | | | | | |
| Phenoxy resin*1 | — | — | — | — | 40 |
| Alicyclic epoxy resin*2 | 20 | 20 | 20 | 20 | 30 |
| Alicyclic epoxy resin*3 | — | — | — | — | 20 |
| Bisphenol A-type epoxy resin*4 | — | — | — | — | 10 |
| Bisphenol A-type epoxy resin*5 | 10 | 10 | 10 | 10 | — |
| Naphthalene-skeleton epoxy resin*6 | 50 | 65 | 10 | 67 | — |
| (Oxetan compound) | | | | | |
| XDO (Toa Gosei K.K.) | 10 | 5 | 30 | 3 | — |
| EOXA (Toa Gosei K.K.) | — | — | — | — | — |
| HOX (Toa Gosei K.K.) | — | — | — | — | — |
| PHO (Toa Gosei K.K.) | 10 | — | 30 | — | — |
| DOX (Toa Gosei K.K.) | — | — | — | — | — |
| Silane coupling agent*7 | 1 | 1 | 1 | 1 | 1 |
| Cationic photopolymerization initiator*8 | — | — | — | — | — |
| Cationic photopolymerization initiator*9 | 3 | 3 | 3 | 3 | 3 |
| Electrically conductive particles*10 | 10 | 10 | 10 | 10 | 10 |
| (Evaluation) | | | | | |
| Rise in resistance | A | A | B | B | C*11 |
| Peeling strength | | | | | |
| (before aging) (mN/cm) | 5880 | 5590 | 4610 | 3920 | 5590 |
| (after aging) (mN/cm) | 5000 | 4510 | 3330 | 2940 | 3920 |

TABLE 2-continued (weight parts)

| Component | Example | | | | Comp. Ex. |
|---|---|---|---|---|---|
| | 7 | 8 | 9 | 10 | |
| Reactivity (%) | 75 | 67 | 88 | 62 | 60 |
| Appearance | A | A | B | B | C |

Tables 1 and 2 notes:
*1: PKHH, Union Carbide
*2: ERL4221, Union Carbide
*3: ERL 4299, Union Carbide
*4: EP828, Yuka shell Epoxy
*5: EP1001, Yuka Shell Epoxy
*6: HP4032D, Dainippon Ink and Chemicals Inc.
*7: A-187, Nihon Unika K.K.
*8: SP-150, Asahi Denka K.K.
*9: SP-170, Asahi Denka k.K.
*10: Ni-Au-plated resin particles (φ 5 μm), Nihon Kagaku Kogyo K.K.
*11: The rise in resistance after aging of the Comparative Example was 3-times that before aging.

It is clear from Tables 1 and 2 that the rise in resistance and occurrence of lifting are inhibited in each example of the present invention when compared to the Comparative Example. Moreover, of the examples of the present invention as well, it is clear that reactivity of the adhesive composition increases and the cured product is hard and floating occurs in Example 9 in which the total amount of oxetan compound mixed is 60 parts by weight (53 wt % of the adhesive composition), while reactivity is low and adding the oxetan compound has little effect in Example 10 in which the amount of oxetan compound used is 3 parts by weight (2.6 wt % of the adhesive composition).

Because reactivity of the adhesive composition of the present invention is high, connection with high reliability is possible by irradiation with ultraviolet rays, etc., at a connection temperature of 100° C. or less. Consequently, it is possible to connect with high connection reliability even plastic substrates that are used in plastic liquid crystal displays with a connecting material, such as anisotropic conductive adhesive film using this adhesive composition.

The entire disclosure of the specification and the claims of Japanese Patent Application No. 2000-21870 filed Jan. 26, 2000 is hereby incorporated by reference.

What is claimed is:

1. An adhesive composition, comprising:
   an insulating resin;
   a photopolymerization initiator;
   electrically conductive particles; and
   an oxetan compound having two oxetane functional groups, wherein, the oxetan compound is bis(1-ethyl (3-oxetanyl))methyl)ether.

2. The adhesive composition according to claim 1, comprising 5 to 50 wt % oxetan compound in 100 wt % adhesive composition.

3. A connected structure, wherein electrodes on a plastic substrate and on a circuit board that are facing each other are connected by the adhesive composition according to claim 1.

4. A connected structure, wherein electrodes on a plastic substrate and on a circuit board that are facing each other are connected by the adhesive composition according to claim 2.

* * * * *